United States Patent
Iguchi (10) Patent No.: US 12,431,685 B2
(45) Date of Patent: Sep. 30, 2025

(54) LIGHT-EMITTING DEVICE, HEAT TRANSFER MEMBER, AND OPTICAL MEASUREMENT DEVICE

(71) Applicant: FUJIFILM Business Innovation Corp., Tokyo (JP)

(72) Inventor: Daisuke Iguchi, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1084 days.

(21) Appl. No.: 17/402,189

(22) Filed: Aug. 13, 2021

(65) Prior Publication Data
US 2022/0311208 A1 Sep. 29, 2022

(30) Foreign Application Priority Data
Mar. 24, 2021 (JP) ................... 2021-050362

(51) Int. Cl.
| | |
|---|---|
| H01S 5/00 | (2006.01) |
| G01S 7/481 | (2006.01) |
| H01S 5/024 | (2006.01) |
| H01S 5/042 | (2006.01) |

(52) U.S. Cl.
CPC ........ *H01S 5/02476* (2013.01); *G01S 7/4814* (2013.01); *H01S 5/04256* (2019.08)

(58) Field of Classification Search
CPC . H01S 5/02476; H01S 5/04256; G01S 7/4814
USPC ........................................................ 361/688
See application file for complete search history.

(56) References Cited

U.S. PATENT DOCUMENTS

| | | | |
|---|---|---|---|
| 10,838,063 B2 * | 11/2020 | Matsuura | G01S 7/4865 |
| 2011/0006664 A1 * | 1/2011 | Hamaguchi | H01S 5/4025 |
| | | | 313/358 |
| 2012/0025215 A1 * | 2/2012 | Chen | H10H 20/8582 |
| | | | 257/690 |
| 2020/0285723 A1 | 9/2020 | Ono et al. | |

(Continued)

FOREIGN PATENT DOCUMENTS

| | | |
|---|---|---|
| EP | 1 806 789 A2 | 7/2007 |
| EP | 3 943 975 A1 | 1/2022 |

(Continued)

OTHER PUBLICATIONS

Mar. 4, 2022 extended Search Report issued in European Patent Application No. 21195227.0.

(Continued)

*Primary Examiner* — Zhengfu J Feng
(74) *Attorney, Agent, or Firm* — Oliff PLC (57) ABSTRACT

A light-emitting device includes: a base material; an electrode that is disposed on a front surface of the base material, that has a light-emitting element on a front surface of the electrode, and that is electrically connected to the light-emitting element; a connection portion disposed at a position separated from the electrode on the front surface of the base material and connected to a conductive portion having a reference potential; and a heat transfer member that includes a contact surface along the front surface of the base material, the contact surface being in contact with a front surface of the electrode and a front surface of the connection portion, the heat transfer member being configured to transfer heat from the electrode to the connection portion.

19 Claims, 6 Drawing Sheets

(56) References Cited

U.S. PATENT DOCUMENTS

2021/0041534 A1\* 2/2021 Egawa .................... G01S 17/10
2021/0325034 A1   10/2021 Sakai et al.

FOREIGN PATENT DOCUMENTS

| JP | H05-082715 | A |   | 4/1993  |        |           |
|----|------------|---|---|---------|--------|-----------|
| JP | H06-169189 | A |   | 6/1994  |        |           |
| JP | H10-084175 | A |   | 3/1998  |        |           |
| JP | 2010267834 | A | * | 11/2010 | ......... | H01L 33/64 |
| JP | 2017204589 | A | * | 11/2017 | ......... | H01L 23/36 |
| JP | 2020-145274 | A |  | 9/2020  |        |           |
| WO | 2020/188838 | A1 |  | 9/2020  |        |           |

OTHER PUBLICATIONS

Oct. 1, 2024 Office Action issued in Japanese Patent Application No. 2021-050362.

\* cited by examiner

LIGHT-EMITTING DEVICE, HEAT TRANSFER MEMBER, AND OPTICAL MEASUREMENT DEVICE

CROSS-REFERENCE TO RELATED APPLICATIONS

This application is based on and claims priority under 35 USC 119 from Japanese Patent Application No. 2021-050362 filed on Mar. 24, 2021.

BACKGROUND

Technical Field

The present invention relates to a light-emitting device, a heat transfer member, and an optical measurement device.

Related Art

Patent Literature 1 discloses a chip shape heat generation component including an electrode for heat dissipation provided to dissipate heat generated by a main body portion in a chip component for surface mounting including the main body portion having a function as a circuit element and an electrode serving as both an electrical connection and a mechanical connection.

Patent Literature 2 discloses a heat transfer method for heat dissipation of an electrical component, in which in an electrical wiring printed substrate on which the electrical component is mounted, an optional heat conductor for transferring heat generated by the electrical component is continuously disposed on optional wiring on the substrate.

CITATION LIST

Patent Literature

[Patent Literature 1]: JP-A-H6-169189
[Patent Literature 2]: JP-A-H10-84175

SUMMARY

As a light-emitting device, a light-emitting device that includes a base material such as a printed substrate, an electrode disposed on a front surface of the base material, and a light-emitting element disposed on a front surface of the electrode, and in which the electrode is electrically connected to the light-emitting element, may be considered. In the light-emitting device, when heat generated by the light-emitting element is transferred only from the electrode to the base material, the heat of the light-emitting element may not be efficiently dissipated.

Aspects of non-limiting embodiments of the present disclosure relate to efficiently dissipating the heat of the light-emitting element as compared with a configuration in which heat generated by a light-emitting element is transferred only from an electrode to a base material.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including: a base material; an electrode that is disposed on a front surface of the base material, that has a light-emitting element on a front surface of the electrode, and that is electrically connected to the light-emitting element; a connection portion disposed at a position separated from the electrode on the front surface of the base material and connected to a conductive portion having a reference potential; and a heat transfer member that includes a contact surface along the front surface of the base material, the contact surface being in contact with a front surface of the electrode and a front surface of the connection portion, the heating transfer member being configured to transfer heat from the electrode to the connection portion.

BRIEF DESCRIPTION OF THE DRAWINGS

Exemplary embodiment(s) of the present invention will be described in detail based on the following figures, wherein.

DETAILED DESCRIPTION

Hereinafter, an example of an exemplary embodiment according to the present invention will be described with reference to the drawings.

(Light-Emitting Device 10)

Figure 1:
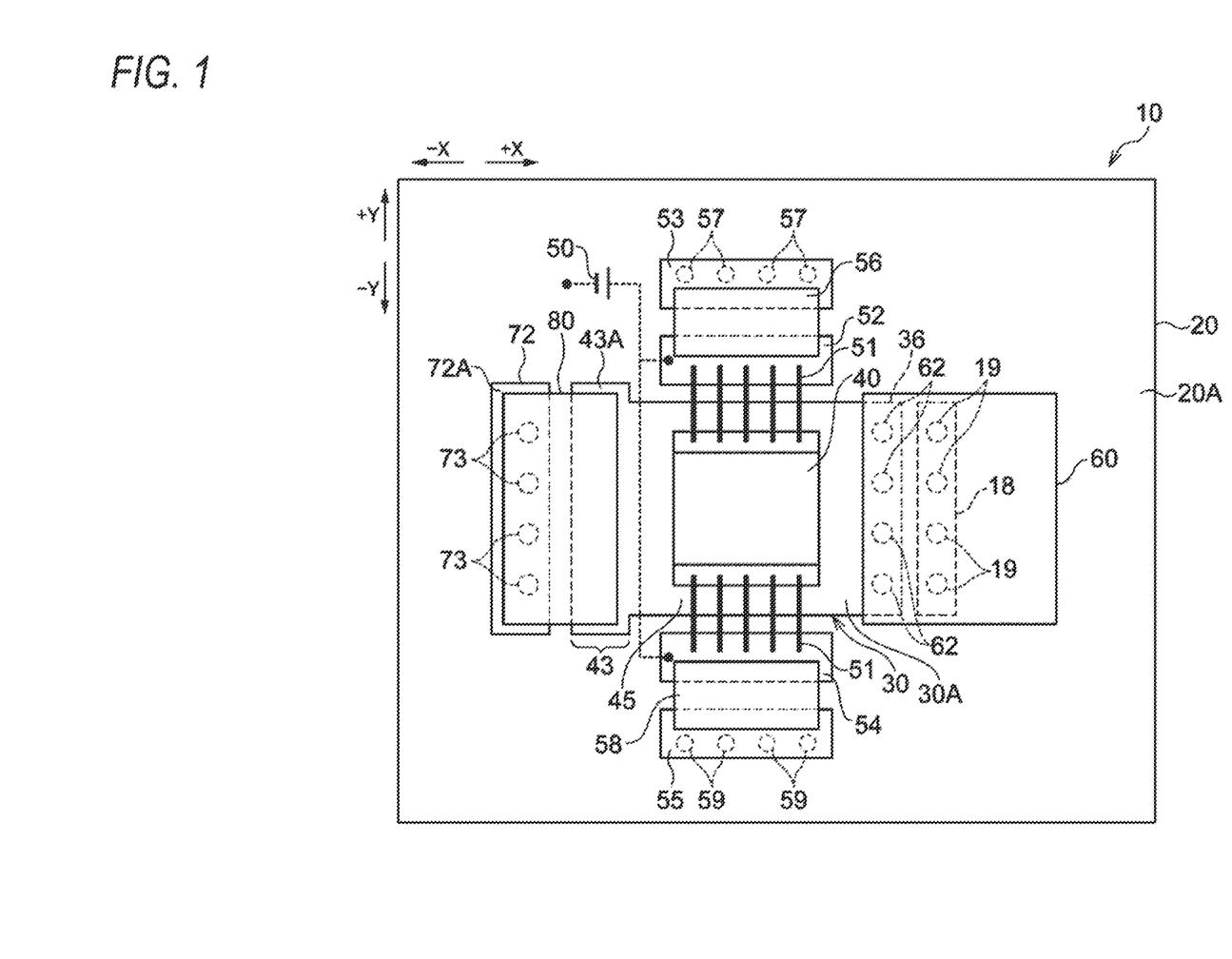
FIG. 1 is a plan view showing a configuration of a light-emitting device according to the present exemplary embodiment.
Figure 2:
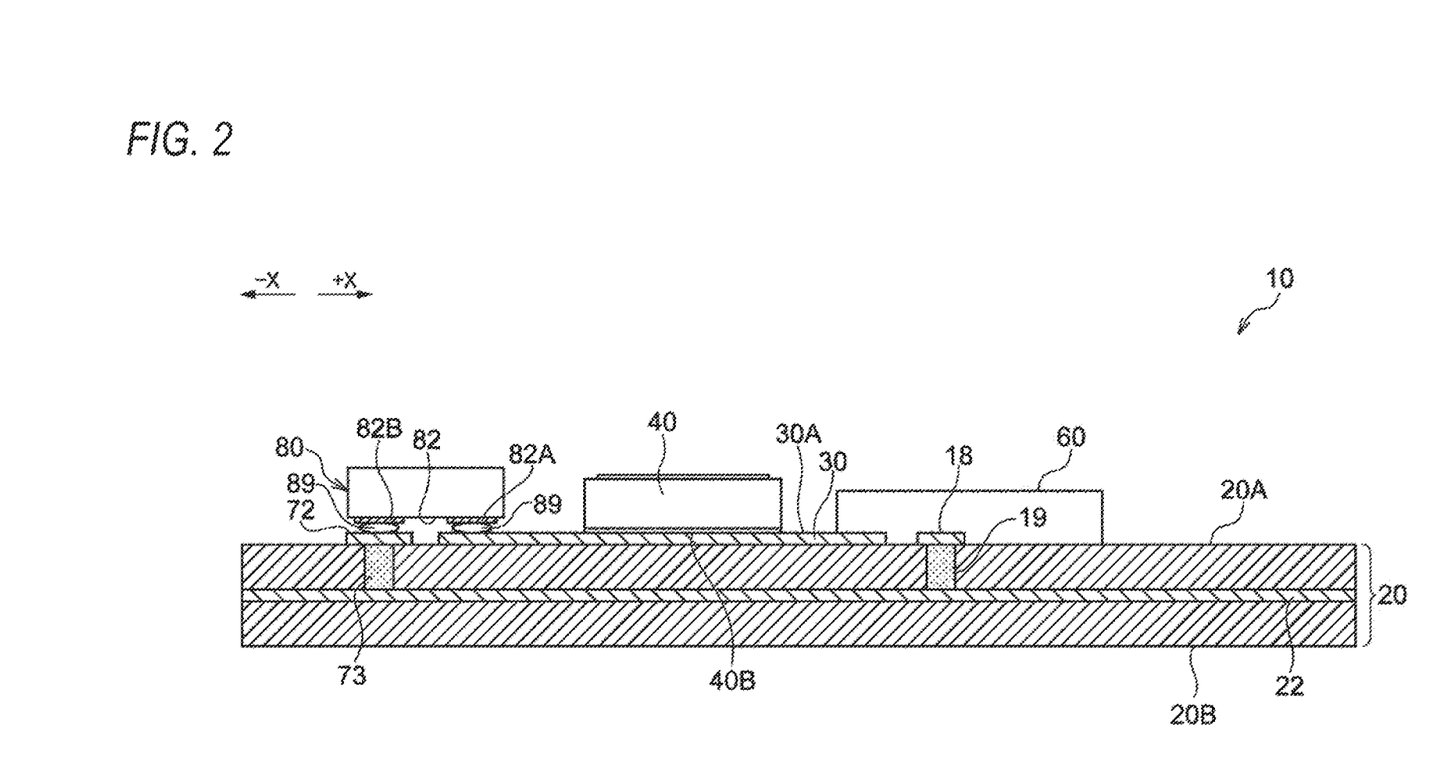
FIG. 2 is a cross-sectional side view showing the configuration of the light-emitting device according to the present exemplary embodiment.

First, a configuration of a light-emitting device 10 according to the present exemplary embodiment will be described. FIG. 1 is a plan view showing the configuration of the light-emitting device 10 according to the present exemplary embodiment. FIG. 2 is a cross-sectional side view showing the configuration of the light-emitting device 10 according to the present exemplary embodiment.

A +X direction, a −X direction, a +Y direction, and a −Y direction used in the following description are arrow directions shown in the drawings. Further, the +X direction and the −X direction, and the +Y direction and the −Y direction are directions intersecting with each other (specifically, directions orthogonal to each other).

The light-emitting device 10 shown in FIGS. 1 and 2 is a device that produces light, that is, a device that emits light. Specifically, as shown in FIGS. 1 and 2, the light-emitting device 10 includes a substrate 20, a light-emitting element 40, a cathode pattern 30, a drive element 60, a connection pattern 72, and a heat transfer member 80. Further, as shown in FIG. 1, the light-emitting device 10 includes anode patterns 52 and 54, ground patterns 53 and 55, and capacitors 56 and 58. The cathode pattern 30, the connection pattern 72, the anode patterns 52 and 54, and the ground patterns 53 and 55 are wiring patterns formed on a front surface 20A of the substrate 20.

The substrate 20 shown in FIGS. 1 and 2 is an example of a "base material". Specifically, the substrate 20 is configured with, for example, a printed substrate having a multi-layer structure using an insulator such as a glass epoxy resin. As shown in FIG. 2, a ground 22 is disposed as an inner layer inside the substrate 20. The ground 22 has a reference potential (that is, a reference potential of 0V (zero volt)) in a circuit that causes the light-emitting element 40 to operate. The ground 22 is an example of a "conductive portion".

The cathode pattern 30 shown in FIGS. 1 and 2 is an example of an "electrode". As shown in FIGS. 1 and 2, the cathode pattern 30 is formed on the front surface 20A of the substrate 20. The front surface 20A of the substrate 20 is one surface of the substrate 20. In the present exemplary embodiment, a surface on an upper side in FIG. 2 serves as the front surface 20A.

Further, the cathode pattern 30 is electrically connected to an electrode of the light-emitting element 40 on a cathode side. The cathode pattern 30 is electrically connected to the electrode of the light-emitting element 40 on the cathode side to constitute a part of the electrode of the light-emitting element 40 on the cathode side.

As shown in FIGS. 1 and 2, the light-emitting element 40 is disposed on a front surface 30A of the cathode pattern 30. The light-emitting element 40 is a portion that generates light to be emitted to an outside of the light-emitting device 10, and is configured using, for example, a vertical cavity surface emitting laser (VCSEL) in which light-emitting points are arranged in a two-dimensional shape. Further, the light-emitting element 40 is configured as, for example, a light-emitting unit having a thyristor structure that functions as a switch for selectively turning on and off a light-emitting point. The light-emitting element 40 may be configured as a light-emitting unit having no thyristor structure.

As shown in FIG. 1, the anode pattern 52 is formed on the front surface 20A of the substrate 20 on a +Y direction side with respect to the light-emitting element 40 and on a +Y direction side with respect to the cathode pattern 30. The anode pattern 54 is formed on the front surface 20A of the substrate 20 on a -Y direction side with respect to the light-emitting element 40 and on a -Y direction side with respect to the cathode pattern 30. Each of the anode patterns 52 and 54 is electrically connected to the electrode of the light-emitting element 40 on the anode side by wire bonding using plural wires 51. The anode patterns 52 and 54 are electrically connected to one terminal of a power supply 50.

The ground pattern 53 is formed on the front surface 20A of the substrate 20 on the +Y direction side with respect to the anode pattern 52. The ground pattern 55 is formed on the front surface 20A of the substrate 20 on the -Y direction side with respect to the anode pattern 54. Each of the ground patterns 53 and 55 is electrically connected to the ground 22 by plural vias 57 and 59 penetrating the substrate 20 from the front surface 20A to the ground 22.

The capacitor 56 is a capacitive element and is provided across the anode pattern 52 and the ground pattern 53. The capacitor 56 is electrically connected to each of the anode pattern 52 and the ground pattern 53.

The capacitor 58 is a capacitive element and is provided across the anode pattern 54 and the ground pattern 55. The capacitor 58 is electrically connected to each of the anode pattern 54 and the ground pattern 55. Electric charges are supplied from the power supply 50 to the capacitors 56 and 58 via the anode patterns 52 and 54, and the electric charges are accumulated in the capacitors 56 and 58. Then, the electric charges accumulated in the capacitors 56 and 58 are supplied to the light-emitting element 40.

The cathode pattern 30 extends to a +X direction side with respect to the light-emitting element 40. An end portion of the cathode pattern 30 on a +X direction side serves as a connection portion 36 connected to the drive element 60, as will be described later.

The drive element 60 is an example of a "drive unit". The drive element 60 is an element that drives the light-emitting element 40 to emit light, and is configured with, for example, a semiconductor integrated circuit. In the present exemplary embodiment, the drive element 60 is disposed on the +X direction side with respect to the light-emitting element 40, and is electrically connected to the connection portion 36 of the cathode pattern 30 via connection terminals 62. The +X direction side is an example of "one direction side along a front surface of the base material".

On the front surface 20A of the substrate 20, a ground pad 18 is formed on the +X direction side with respect to the connection portion 36. The ground pad 18 is electrically connected to the ground 22 by plural vias 19 penetrating the substrate 20 from the front surface 20A to the ground 22. Further, the ground pad 18 is connected to a terminal (not shown) for connecting the drive element 60 to the ground 22.

The cathode pattern 30 extends to the -X direction side with respect to the light-emitting element 40. Therefore, the cathode pattern 30 includes an extension portion 43 extended to the -X direction side with respect to the light-emitting element 40. The -X direction side is a direction side opposite to the drive element 60 with respect to the light-emitting element 40.

Specifically, the extension portion 43 is disposed on the -X direction side with respect to the anode patterns 52 and 54, and has a width in the -Y direction wider than that of a disposition portion 45 of the cathode pattern 30 where the light-emitting element 40 is disposed. The -Y direction is an example of an "intersecting direction intersecting the opposite direction".

(Structure in which Cathode Pattern 30 is Thermally Connected to Ground 22)

Here, a structure in which the cathode pattern 30 is thermally connected to the ground 22 (hereinafter, referred to as connection structure) will be described. The term "thermally connected" refers to connection so as to transfer heat between connection targets.

The connection structure has a function of transferring heat generated in the light-emitting element 40 to the ground 22. Specifically, in the present exemplary embodiment, the connection structure includes the connection pattern 72, plural vias 73, and the heat transfer member 80.

As shown in FIGS. 1 and 2, the connection pattern 72 is disposed at a position separated from the cathode pattern 30 on the front surface 20A of the substrate 20. Specifically, the connection pattern 72 is disposed on the -X direction side with respect to the extension portion 43 of the cathode pattern 30 with a gap between the connection pattern 72 and the cathode pattern 30. The plural vias 73 penetrate from the connection pattern 72 to the ground 22, and electrically and thermally connect the connection pattern 72 and the ground 22. Accordingly, the plurality of vias 73 transfer heat from the connection pattern 72 to the ground 22.

The heat transfer member 80 is a member that transfers heat from the cathode pattern 30 to the connection pattern 72. The heat transfer member 80 is configured with a high thermal conductivity insulator. Specifically, for example, ceramic such as aluminum nitride is used as the heat transfer member 80. More specifically, the heat transfer member 80 is a member having a thermal conductivity higher than that of the substrate 20. Specifically, the heat transfer member 80 is formed of a material having a thermal conductivity higher than that of the substrate 20. In the present exemplary embodiment, the high thermal conductivity refers to a case where the thermal conductivity is 10 [W/mK] or more. Further, in the present exemplary embodiment, the insulator refers to a structural body having a volume resistivity of $10^{13}$ [Ω·cm] or more.

Further, the heat transfer member 80 is formed in a block shape (that is, a rectangular parallelepiped shape), and has a contact surface 82 along the front surface 20A of the substrate 20 as shown in FIG. 2. The contact surface 82 is in contact with the front surface 30A of the cathode pattern 30 (specifically, a front surface 43A of the extension portion 43) and a front surface 72A of the connection pattern 72. Specifically, the heat transfer member 80 is disposed from the extension portion 43 toward the −X direction side, and the contact surface 82 is in contact with the connection pattern 72 on the −X direction side with respect to the extension portion 43. Accordingly, the heat transfer member 80 transfers heat from the extension portion 43 of the cathode pattern 30 to the connection pattern 72.

In the contact surface 82 of the heat transfer member 80, each of a contact portion 82A with the front surface 30A of the cathode pattern 30 and a contact portion 82B with the front surface 72A of the connection pattern 72 is metalized in an electrically separated state. Here, the term "metalized" refers to forming a metal film on a non-metal surface. Specifically, the metal film is formed on a surface of the heat transfer member 80 by, for example, a vapor deposition method such as chemical vapor deposition (CVD) or physical vapor deposition (PVD). As an example, a metal material such as aluminum or copper is used for the metal film. Each of the contact portion 82A and the contact portion 82B is bonded to each of the front surface 30A of the cathode pattern 30 and the front surface 72A of the connection pattern 72 by a bonding material 89 having affinity for metal. As the bonding material 89, for example, a metal material such as solder or silver paste is used.

In the heat transfer member 80, heat is transferred from the contact portion 82A to the contact portion 82B through the insulator portion, so that the contact portion 82A may be said to be a contact portion in contact with a heat transfer target from which heat is taken away. On the other hand, the contact portion 82B may be said to be a contact portion in contact with a heat transfer object to which the heat is transferred. The contact portion 82A is an example of a "first contact portion". The contact portion 82B is an example of a "second contact portion".

In the present exemplary embodiment, a direction in which the heat transfer member 80 transfers heat from the cathode pattern 30 to the connection pattern 72 is different from a direction in which a current flows between the light-emitting element 40 and the cathode pattern 30. Specifically, the contact surface 82 of the heat transfer member 80 is in contact with the front surface 30A of the cathode pattern 30 and the front surface 72A of the connection pattern 72, and the heat transfer member 80 transfers heat from the cathode pattern 30 to the connection pattern 72 along the contact surface 82. Therefore, in the heat transfer member 80, heat is transferred in the −X direction. The light-emitting element 40 is in contact with the front surface 30A of the cathode pattern 30 on a bottom surface 40B, and a current flows in a direction perpendicular to the substrate 20 between the light-emitting element 40 and the cathode pattern 30. As described above, in the present exemplary embodiment, the heat transfer direction in the heat transfer member 80 is different from the direction in which the current flows between the light-emitting element 40 and the cathode pattern 30.

As described above, since the heat transfer member 80 is configured with the high thermal conductivity insulator, the cathode pattern 30 and the connection pattern 72 are thermally connected to each other, but are electrically separated from each other. An electrically separated state is a non-conductive state where conduction is not established between separated members and electricity does not flow between the separated members.

(Application Example of Light-Emitting Device 10)

Figure 6:
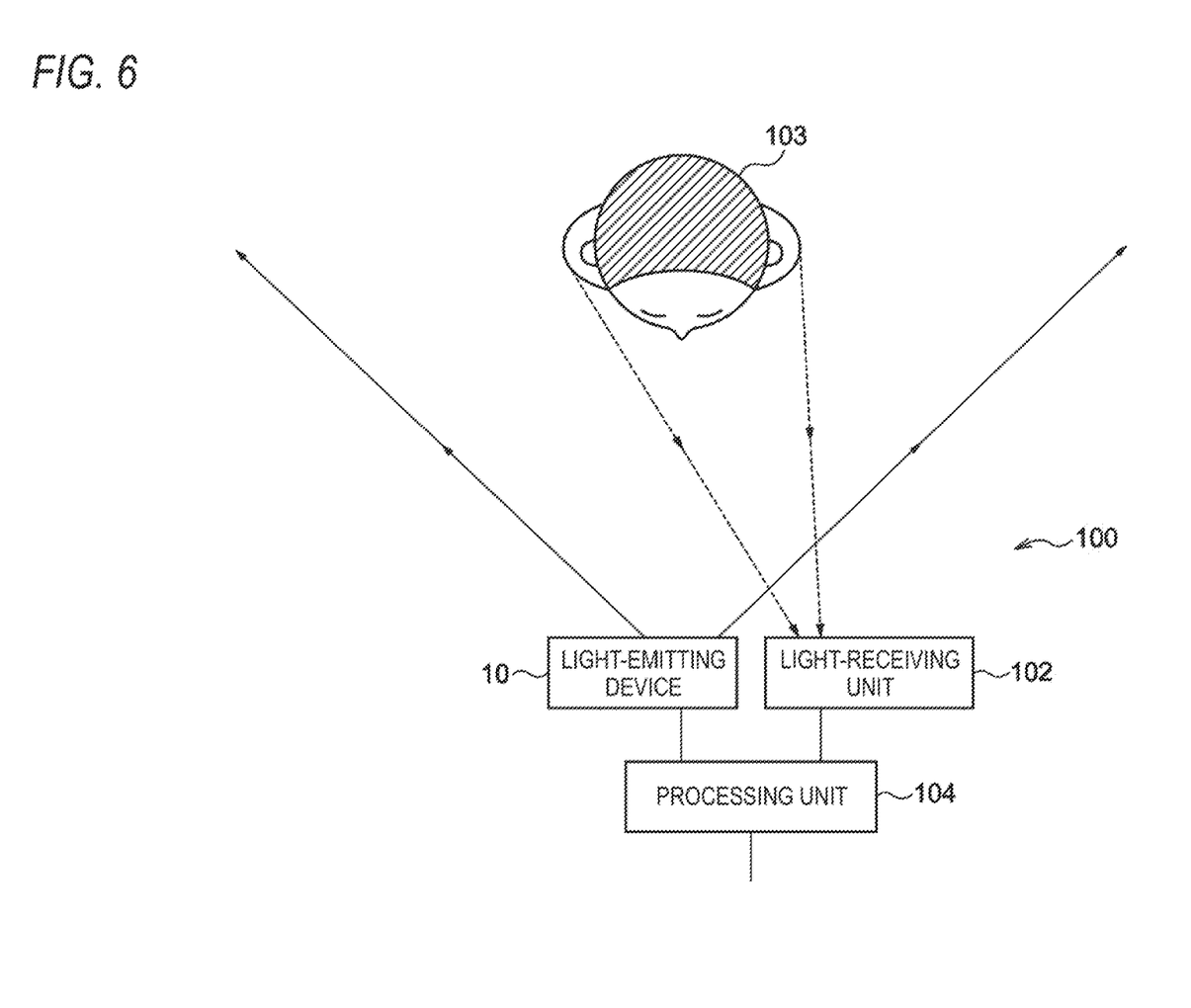
FIG. 6 is a schematic diagram showing a configuration of an optical measurement device to which the light-emitting device according to the present exemplary embodiment is applied.

As an example, the light-emitting device 10 may be applied to an optical measurement device 100 shown in FIG. 6. The optical measurement device 100 shown in FIG. 6 includes the above-described light-emitting device 10, a light-receiving unit 102, and a processing unit 104. In the optical measurement device 100, a target object 103 is placed so as to face the light-emitting device 10 and the light-receiving unit 102. In FIG. 6, the target object 103 is, for example, a person. Further, FIG. 6 is a schematic diagram of the optical measurement device 100 when viewed from above.

As an example, as indicated by a solid line in FIG. 6, the light-emitting device 10 irradiates the target object 103 with two-dimensionally spread light. As indicated by a broken line in FIG. 6, the light-receiving unit 102 receives reflected light from the target object 103 irradiated with the light from the light-emitting device 10. As the light-receiving unit 102, for example, an image-capturing device that receives light from a two-dimensional direction is used.

The processing unit 104 is configured as, for example, a computer including an input and output unit that inputs and outputs data. The processing unit 104 measures a distance from the light-emitting device 10 to the target object 103 or a shape of the target object 103. Specifically, the processing unit 104 operates as follows.

The processing unit 104 controls the light-emitting device 10 and causes the light-emitting device 10 to emit light in a short period of time. That is, the light-emitting device 10 emits light in a pulsed manner. Then, the processing unit 104 calculates an optical path length from when the light is emitted from the light-emitting device 10 to when the light is reflected by the target object 103 and reaches the light-receiving unit 102, based on a time difference between a point of time when the light-emitting device 10 emits the light and a point of time when the light-receiving unit 102 receives reflected light from the target object 103. Positions of the light-emitting device 10 and the light-receiving unit 102 and an interval therebetween are predetermined. Therefore, the processing unit 104 measures a distance from the target object 103 based on a distance from the light-emitting device 10 and the light-receiving unit 102, or a point serving as a reference (hereinafter, referred to as reference point). The reference point is a point provided at a predetermined position from the light-emitting device 10 and the light-receiving unit 102.

The method is a measurement method based on an arrival time of light, and is called a time-of-flight (TOF) method. If the method is performed on plural points on the target object 103, a three-dimensional shape of the target object 103 is measured. As described above, the light from the light-emitting device 10 spreads two-dimensionally and is radiated to the target object 103. Then, reflected light from a portion of the target object 103 having a short distance from the light-emitting device 10 is quickly incident on the light-receiving unit 102. When the above-mentioned image-capturing device that acquires a two-dimensional image is used, a bright spot is recorded in a portion of a frame image where the reflected light reaches. An optical path length is calculated for each bright spot based on bright spots recorded in a series of frame images. Then, the distance from the light-emitting device 10 and the light-receiving unit 102 or a distance from the reference point is calculated. That is, a three-dimensional shape of the target object 103 is calculated.

As another method, the light-emitting device 10 of the present exemplary embodiment may be used for a light measurement method using a structured light method. An optical measurement device to be used is substantially the same as the optical measurement device 100 shown in FIG. 6 using the light-emitting device 10. A difference is that a pattern of the light with which the target object 103 is irradiated is an infinite number of light dots (a random pattern), and the light-receiving unit 102 receives the light dots. Then, the processing unit 104 processes information on the light. Here, as a method of processing, the distance to the target object 103 and the three-dimensional shape of the target object 103 are calculated by calculating a positional deviation amount of the infinite number of light dots, instead of obtaining the time difference described above.

The optical measurement device 100 as described above may be applied to calculation of a distance from an article. Further, the optical measurement device 100 may calculate a shape of the article and may be applied to identification of the article. Then, the optical measurement device 100 may calculate a shape of a face of a person and may be applied to identification (face authentication). Further, the optical measurement device 100 may be applied to detection of an obstacle on a front side, a rear side, a lateral side, or the like by being mounted on a vehicle. As described above, the optical measurement device 100 may be widely used for calculating a distance, a shape, and the like.

The light-emitting device 10 is not limited to the optical measurement device 100 described above, and may be applied to various devices. For example, the light-emitting device 10 may be applied to optical transmission in a combination of the light-emitting device 10, an optical transmission path, and a light-receiving unit, or may be applied to biological detection in which light emitted from the light-emitting device 10 enters an inside of a detection target object, or the like.

Effects According to Present Exemplary Embodiment

In the present exemplary embodiment, heat generated by the light-emitting element 40 is transferred from the light-emitting element 40 to the cathode pattern 30, the extension portion 43, the heat transfer member 80, the connection pattern 72, the vias 73, and the ground 22 in this order, and is dissipated to the ground 22. The heat generated by the light-emitting element 40 is also slightly transferred from the cathode pattern 30 to the substrate 20.

As described above, in the present exemplary embodiment, since the heat generated by the light-emitting element 40 is transferred to the ground 22 through the heat transfer member 80, the connection pattern 72, the vias 73, and the like, as compared with a configuration in which heat generated by the light-emitting element 40 is transferred only from the cathode pattern 30 to the substrate 20, the heat from the light-emitting element 40 is efficiently dissipated. Therefore, according to the present exemplary embodiment, a degree of a temperature decreases per unit time in the light-emitting element 40 is increased as compared with the configuration in which the heat generated by the light-emitting element 40 is transferred only from the cathode pattern 30 to the substrate 20. As a result, the light-emitting element 40 may be driven at a high output and a high duty ratio.

In the present exemplary embodiment, since the heat transfer member 80 is configured with an insulator, conduction between the cathode pattern 30 and the connection pattern 72 is prevented as compared with a configuration in which the heat transfer member 80 is a conductor. Accordingly, a state where the cathode pattern 30 and the ground 22 are electrically separated is maintained.

In the present exemplary embodiment, in the contact surface 82 of the heat transfer member 80, each of the contact portion 82A with the front surface 30A of the cathode pattern 30 and the contact portion 82B with the front surface 72A of the connection pattern 72 is metalized in the electrically separated state. Therefore, as in the present exemplary embodiment, each of the cathode pattern 30 and the connection pattern 72 may be bonded to the heat transfer member 80 by using the bonding material 89 having affinity for metal.

In the present exemplary embodiment, the contact surface 82 of the heat transfer member 80 is in contact with the extension portion 43 that extends to the direction side opposite to the drive element 60 with respect to the light-emitting element 40. Therefore, the heat transfer member 80 and the cathode pattern 30 are brought into contact with each other by using a space on the direction side opposite to the drive element 60 with respect to the light-emitting element 40. Therefore, the dead space on the direction side opposite to the drive element 60 with respect to the light-emitting element is effectively used.

In the present exemplary embodiment, the heat transfer member 80 is disposed from the extension portion 43 toward the −X direction side, and the contact surface 82 is in contact with the connection pattern 72 on the −X direction side with respect to the extension portion 43. Therefore, the heat transfer member 80 and the contact surface 82 are brought into contact with each other by using the space on the −X direction side with respect to the extension portion 43. Therefore, the dead space on the −X direction side with respect to the extension portion 43 is effectively used.

In the present exemplary embodiment, the extension portion 43 has the width in the −Y direction wider than that of the disposition portion 45 of the cathode pattern 30 where the light-emitting element 40 is disposed. Therefore, as compared with a configuration in which the extension portion 43 has the same width as that of the disposition portion 45, a contact width with the heat transfer member 80 is increased. As a result, the heat from the light-emitting element 40 is efficiently dissipated.

In the present exemplary embodiment, the contact surface 82 of the heat transfer member 80 is in contact with the front surface 30A of the cathode pattern 30 and the front surface 72A of the connection pattern 72, and the heat transfer member 80 transfers heat from the cathode pattern 30 to the connection pattern 72 along the contact surface 82. Therefore, in the heat transfer member 80, heat is transferred in the −X direction. Therefore, the direction in which the heat transfer member 80 transfers heat from the cathode pattern 30 to the connection pattern 72 is different from the direction in which the current flows between the light-emitting element 40 and the cathode pattern 30. Therefore, as compared with a configuration in which a direction in which the heat transfer member 80 transfers heat from the cathode pattern 30 to the connection pattern 72 is the same as a direction in which a current flows between the light-emitting element 40 and the cathode pattern 30, it is possible to dissipate heat at a position that does not influence a current path.

In the present exemplary embodiment, the heat transfer member 80 has a thermal conductivity higher than that of the substrate 20. Therefore, as compared with a configuration in which the heat transfer member 80 has the same thermal conductivity as that of the substrate 20, a heat dissipation effect of dissipating the heat of the light-emitting element 40 to the ground 22 is high.

According to the heat transfer member 80 in the present exemplary embodiment, it is possible to bond each of the heat transfer target and the heat transfer object to the heat transfer member by using the bonding material having affinity for metal while preventing conduction between the cathode pattern 30 that is the heat transfer target and the connection pattern 72 that is the heat transfer object.

(First Modified Example of Cathode Pattern 30)

Figure 3:
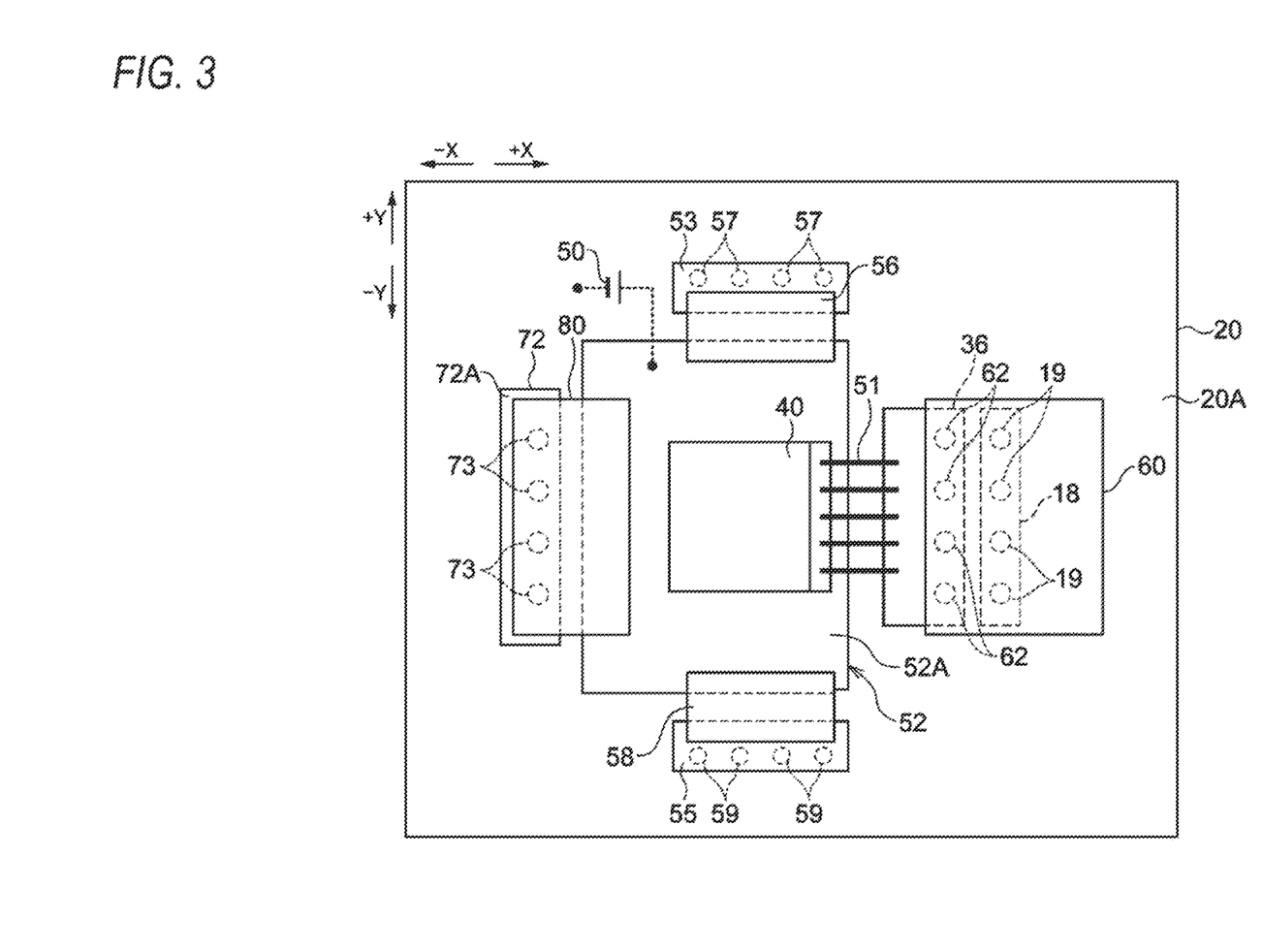
FIG. 3 is a plan view showing a configuration of a light-emitting device according to a first modified example.

In the present exemplary embodiment, the cathode pattern 30 is used as an example of an electrode, but the present invention is not limited thereto. As an example of the electrode, as shown in FIG. 3, for example, the anode pattern 52 may be used. Hereinafter, a configuration shown in FIG. 3 will be described. Portions having the same functions as those of the configuration shown in FIGS. 1 and 2 described above are appropriately denoted by the same reference numerals, and description thereof will be omitted.

In the configuration shown in FIG. 3, the light-emitting element 40 is disposed on a front surface 52A of the anode pattern 52 formed on the front surface 20A of the substrate 20. The anode pattern 52 is electrically connected to an electrode of the light-emitting element 40 on an anode side to constitute a part of the electrode of the light-emitting element 40 on the anode side.

The ground pattern 53 is formed on the front surface 20A of the substrate 20 on a +Y direction side with respect to the light-emitting element 40 and on the +Y direction side with respect to the anode pattern 52. The capacitor 56 is provided across the anode pattern 52 and the ground pattern 53. The capacitor 56 is electrically connected to each of the anode pattern 52 and the ground pattern 53.

The ground pattern 55 is formed on the front surface 20A of the substrate 20 on the −Y direction side with respect to the light-emitting element 40 and on the −Y direction side with respect to the anode pattern 52. The capacitor 58 is provided across the anode pattern 52 and the ground pattern 55. The capacitor 58 is electrically connected to each of the anode pattern 52 and the ground pattern 55.

The cathode pattern 30 is formed on the front surface 20A of the substrate 20 on a +X direction side with respect to the light-emitting element 40 and on the +X direction side with respect to the anode pattern 52. The cathode pattern 30 is electrically connected to the electrode of the light-emitting element 40 on the cathode side by wire bonding using the plurality of wires 51.

An end portion of the cathode pattern 30 on the +X direction side serves as the connection portion 36 connected to the drive element 60. The drive element 60 is disposed on the +X direction side with respect to the light-emitting element 40, and is electrically connected to the connection portion 36 of the cathode pattern 30 via the connection terminals 62. The ground pad 18 is formed on the front surface 20A of the substrate 20 on the +X direction side with respect to the connection portion 36.

In the configuration shown in FIG. 3, the heat transfer member 80 is in contact with the front surface 52A of the anode pattern 52 and the front surface 72A of the connection pattern 72. Accordingly, the heat transfer member 80 transfers heat from the anode pattern 52 to the connection pattern 72.

(Second Modified Example of Cathode Pattern 30)

Figure 4:
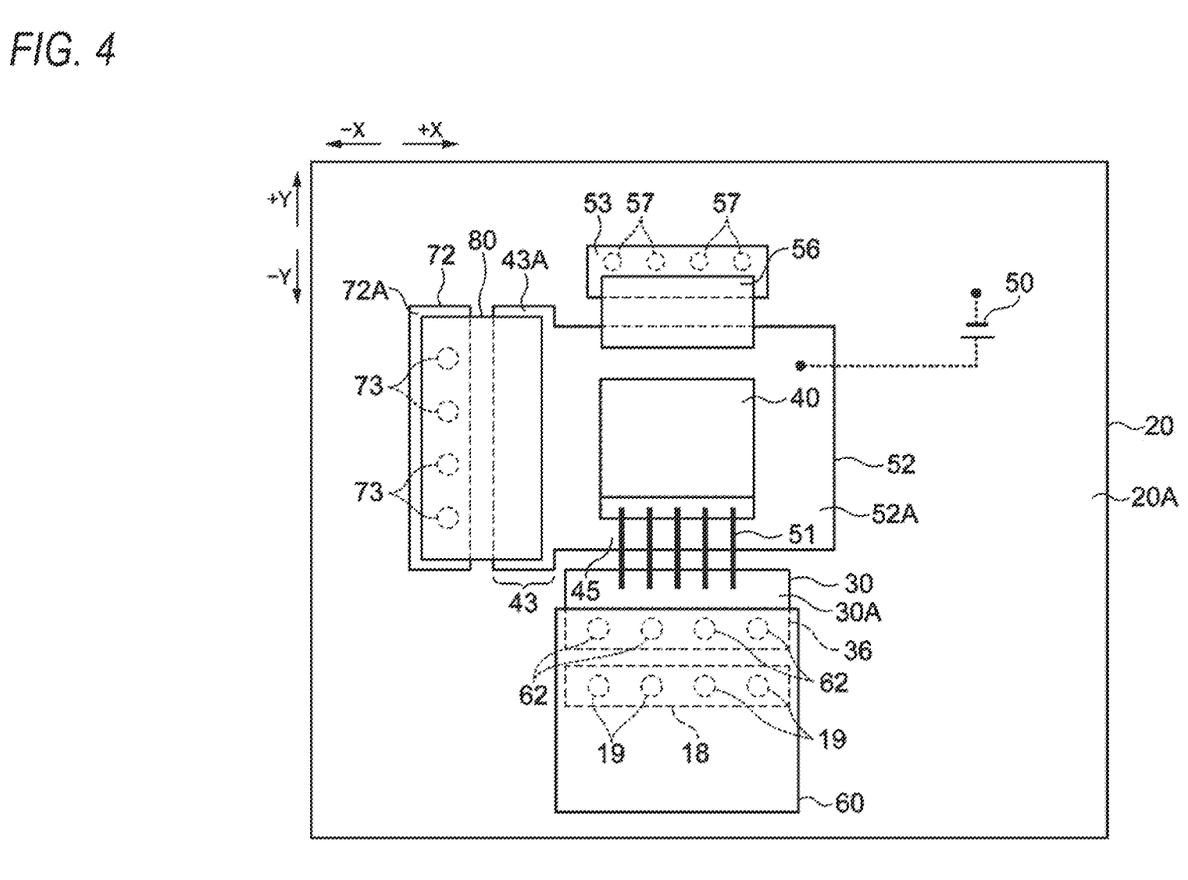
FIG. 4 is a plan view showing a configuration of a light-emitting device according to a second modified example.

As an example of an electrode, the anode pattern 52 as shown in FIG. 4 may be used. Hereinafter, a configuration shown in FIG. 4 will be described. Portions having the same functions as those of the configuration shown in FIGS. 1 and 2 described above are appropriately denoted by the same reference numerals, and description thereof will be omitted.

In the configuration shown in FIG. 4, the light-emitting element 40 is disposed on the front surface 52A of the anode pattern 52 formed on the front surface 20A of the substrate 20. The anode pattern 52 is electrically connected to an electrode of the light-emitting element 40 on an anode side to constitute a part of the electrode of the light-emitting element 40 on the anode side.

The ground pattern 53 is formed on the front surface 20A of the substrate 20 on a +Y direction side with respect to the light-emitting element 40 and on the +Y direction side with respect to the anode pattern 52. The capacitor 56 is provided across the anode pattern 52 and the ground pattern 53. The capacitor 56 is electrically connected to each of the anode pattern 52 and the ground pattern 53.

The cathode pattern 30 is formed on the front surface 20A of the substrate 20 on a −Y direction side with respect to the light-emitting element 40 and on the −Y direction side with respect to the anode pattern 52. The cathode pattern 30 is electrically connected to the electrode of the light-emitting element 40 on the cathode side by wire bonding using the plurality of wires 51.

An end portion of the cathode pattern 30 on the −Y direction side serves as the connection portion 36 connected to the drive element 60. The drive element 60 is disposed on the −Y direction side with respect to the light-emitting element 40, and is electrically connected to the connection portion 36 of the cathode pattern 30 via the connection terminals 62. The ground pad 18 is formed on the front surface 20A of the substrate 20 on the −Y direction side with respect to the connection portion 36.

In the configuration shown in FIG. 4, the anode pattern 52 extends to a −X direction side with respect to the light-emitting element 40. Therefore, the anode pattern 52 includes the extension portion 43 extended to the −X direction side with respect to the light-emitting element 40. Specifically, the extension portion 43 is disposed on the −X direction side with respect to the cathode pattern 30, and has a width in the −Y direction wider than that of the disposition portion 45 of the anode pattern 52 where the light-emitting element 40 is disposed. Then, the heat transfer member 80 is in contact with the front surface 43A of the extension portion 43 of the anode pattern 52 and the front surface 72A of the connection pattern 72. Accordingly, the heat transfer member 80 transfers heat from the extension portion 43 of the anode pattern 52 to the connection pattern 72.

(Other Application Examples of Heat Transfer Member 80)

Figure 5:
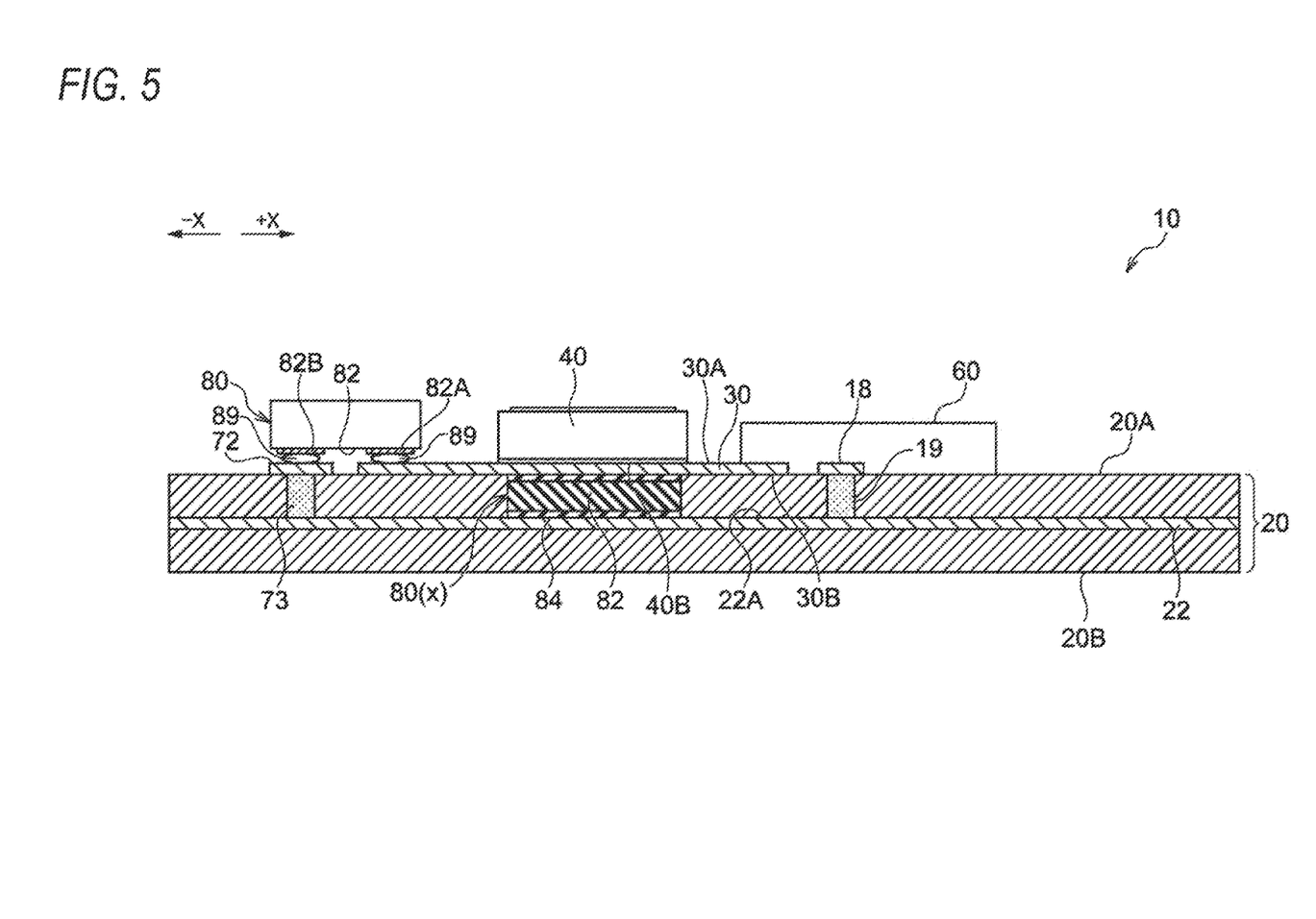
FIG. 5 is a cross-sectional side view showing another application example of a heat transfer member.

As shown in FIG. 5, the heat transfer member 80 may be disposed between the cathode pattern 30 and the ground 22. Hereinafter, a specific configuration of the heat transfer member 80 will be described. The heat transfer member 80 is referred to as a heat transfer member 80 (X) in order to distinguish the heat transfer member 80 from the above-described heat transfer member 80. Further, description of the same portions as those of the above-described heat transfer member 80 will be appropriately omitted.

As shown in FIG. 5, specifically, the heat transfer member 80 (X) is disposed between the cathode pattern 30 and the ground 22 at a position on a lower side with respect to the light-emitting element 40. The heat transfer member 80 (X) includes contact surfaces 82 and 84 along the front surface 20A of the substrate 20. Specifically, one surface (specifically, an upper surface in FIG. 5) of the heat transfer member 80 (X) serves as the contact surface 82, and the other surface (specifically, a lower surface in FIG. 5) of the heat transfer member 80 (X) serves as the contact surface 84.

Each of the contact surface 82 and the contact surface 84 is in contact with a back surface 30B of the cathode pattern 30 and a front surface 22A of the ground 22. Accordingly, the heat transfer member 80 (X) transfers heat from the cathode pattern 30 to the ground 22. In this case, heat is transferred from the cathode pattern 30 to the ground 22 without passing through the connection pattern 72 and the vias 73. Further, in this case, the heat transfer member 80 (X) transfers heat in a direction perpendicular to the substrate 20. Therefore, both the heat transfer direction in the heat transfer member 80 and a direction in which a current flows between the light-emitting element 40 and the cathode pattern 30 are perpendicular to the substrate 20.

In the heat transfer member 80 (X), each of the contact surface 82 and the contact surface 84 is metalized in an electrically separated state. In the heat transfer member 80 (X), the heat is transferred from the contact surface 82 to the contact surface 84 through an insulator portion, so that the contact surface 82 may be said to be a contact portion in contact with a heat transfer target from which heat is taken away. On the other hand, the contact surface 84B may be said to be a contact portion in contact with a heat transfer object to which the heat is transferred. The contact surface 82 is an example of a "first contact portion". The contact surface 84 is an example of a "second contact portion".

OTHER MODIFIED EXAMPLES

In the present exemplary embodiment, the substrate 20 is used as an example of a base material, but the present invention is not limited thereto. As an example of the base material, for example, a heat dissipation member that is provided on the front surface 20A of the substrate 20 and has a thermal conductivity higher than that of the substrate 20 may be used, or a member other than the substrate 20 may be used.

In the present exemplary embodiment, the heat transfer member 80 is configured with the insulator, but the present invention is not limited thereto. For example, the heat transfer member 80 may be a conductor. In this case, for example, an insulator is used in at least one of the connection pattern 72 and the vias 73, and a state where the cathode pattern 30 and the ground 22 are electrically separated is maintained.

In the present exemplary embodiment, in the contact surface 82 of the heat transfer member 80, each of the contact portion 82A with the front surface 30A of the cathode pattern 30 and the contact portion 82B with the front surface 72A of the connection pattern 72 is metalized in an electrically separated state. However, the present invention is not limited thereto, the heat transfer member 80 including the not processed contact surface 82 may be used.

In the present exemplary embodiment, the heat transfer member 80 is in contact with the connection pattern 72 formed on the front surface 20A of the substrate 20, but the present invention is not limited thereto. For example, the connection pattern 72 may not be formed on the front surface 20A of the substrate 20, and the heat transfer member 80 may be in direct contact with the vias 73, or may be in contact with a member that transfers heat to the ground 22. In a configuration in which the heat transfer member 80 is in contact with the vias 73, the via 73 functions as an example of a "connection portion".

In the present exemplary embodiment, the extension portion 43 extends to the direction side opposite to the drive element 60 with respect to the light-emitting element 40, but the present invention is not limited thereto. The extension portion 43 may be configured to, for example, be extended in the +Y direction or the −Y direction.

In the present exemplary embodiment, the extension portion 43 has the width in the −Y direction wider than that of the disposition portion 45 of the cathode pattern 30 where the light-emitting element 40 is disposed, but the present invention is not limited thereto. For example, the extension portion 43 may have the same width as that of the disposition portion 45.

In the present exemplary embodiment, the direction in which the heat transfer member 80 transfers heat from the cathode pattern 30 to the connection pattern 72 is different from the direction in which the current flows between the light-emitting element 40 and the cathode pattern 30, but the present invention is not limited thereto. For example, the direction in which the heat transfer member 80 transfers heat from the cathode pattern 30 to the connection pattern 72 may be the same as the direction in which the current flows between the light-emitting element 40 and the cathode pattern 30 (see FIG. 5).

In the present exemplary embodiment, as shown in FIG. 2, the ground 22 is disposed inside the substrate 20 as the inner layer, but the present invention is not limited thereto. For example, the ground 22 may be disposed on a back surface 20B of the substrate 20 (that is, a surface on a side opposite to the front surface 20A).

The present invention is not limited to the above-described exemplary embodiment, and various modifications, changes, and improvements are possible without departing from the gist of the present invention. For example, plural modified examples described above may be combined as appropriate.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting device comprising:
   a base material;
   an electrode that is disposed on a front surface of the base material, that has a light-emitting element on a front surface of the electrode, and that is electrically connected to an entire bottom surface of the light-emitting element;

a connection portion disposed at a position separated from the electrode on the front surface of the base material and connected to a conductive portion having a reference potential; and
a heat transfer member comprising a contact surface along the front surface of the base material, the contact surface being in contact with the front surface of the electrode and a front surface of the connection portion, the heat transfer member being configured to transfer heat from the electrode to the connection portion.

2. The light-emitting device according to claim 1, wherein the heat transfer member is an insulator.

3. The light-emitting device according to claim 2, wherein a first contact portion on the contact surface of the heat transfer member that is in contact with the front surface of the electrode and a second contact portion on the contact surface of the heat transfer member that is in contact with the front surface of the connection portion are metalized in an electrically separated state from each other.

4. The light-emitting device according to claim 1, further comprising:
a drive unit disposed on one direction side along the front surface of the base material with respect to the light-emitting element and configured to drive the light-emitting element,
wherein the electrode extends from the light-emitting element to a direction side opposite to the drive unit with respect to the light-emitting element, and
wherein the contact surface is in contact with an extension portion of the electrode.

5. The light-emitting device according to claim 2, further comprising:
a drive unit disposed on one direction side along the front surface of the base material with respect to the light-emitting element and configured to drive the light-emitting element,
wherein the electrode extends from the light-emitting element to a direction side opposite to the drive unit with respect to the light-emitting element, and
wherein the contact surface is in contact with an extension portion of the electrode.

6. The light-emitting device according to claim 3, further comprising:
a drive unit disposed on one direction side along the front surface of the base material with respect to the light-emitting element and configured to drive the light-emitting element,
wherein the electrode extends from the light-emitting element to a direction side opposite to the drive unit with respect to the light-emitting element, and
wherein the contact surface is in contact with an extension portion of the electrode.

7. The light-emitting device according to claim 4, wherein the connection portion is disposed on the opposite direction side with respect to the extension portion, and
wherein the heat transfer member is disposed from the extension portion toward the opposite direction side, and the contact surface is in contact with the connection portion on the opposite direction side with respect to the extension portion.

8. The light-emitting device according to claim 5, wherein the connection portion is disposed on the opposite direction side with respect to the extension portion, and
wherein the heat transfer member is disposed from the extension portion toward the opposite direction side, and the contact surface is in contact with the connection portion on the opposite direction side with respect to the extension portion.

9. The light-emitting device according to claim 6, wherein the connection portion is disposed on the opposite direction side with respect to the extension portion, and
wherein the heat transfer member is disposed from the extension portion toward the opposite direction side, and the contact surface is in contact with the connection portion on the opposite direction side with respect to the extension portion.

10. The light-emitting device according to claim 4, wherein a width of the extension portion in an intersecting direction that intersects the opposite direction is wider than a width in the intersecting direction of the electrode where the light-emitting element is disposed.

11. The light-emitting device according to claim 5, wherein a width of the extension portion in an intersecting direction that intersects the opposite direction is wider than a width in the intersecting direction of the electrode where the light-emitting element is disposed.

12. The light-emitting device according to claim 6, wherein a width of the extension portion in an intersecting direction that intersects the opposite direction is wider than a width in the intersecting direction of the electrode where the light-emitting element is disposed.

13. The light-emitting device according to claim 7, wherein a width of the extension portion in an intersecting direction that intersects the opposite direction is wider than a width in the intersecting direction of the electrode where the light-emitting element is disposed.

14. The light-emitting device according to claim 8, wherein a width of the extension portion in an intersecting direction that intersects the opposite direction is wider than a width in the intersecting direction of the electrode where the light-emitting element is disposed.

15. The light-emitting device according to claim 9, wherein a width of the extension portion in an intersecting direction that intersects the opposite direction is wider than a width in the intersecting direction of the electrode where the light-emitting element is disposed.

16. The light-emitting device according to claim 1, wherein a direction in which the heat transfer member transfers heat from the electrode to the connection portion is different from a direction in which a current flows between the light-emitting element and the electrode.

17. The light-emitting device according to claim 1, wherein a thermal conductivity of the heat transfer member is higher than a thermal conductivity of the base material.

18. An optical measurement device comprising:
the light-emitting device according to claim 1;
a light-receiving unit configured to receive reflected light from a target object irradiated with light from the light-emitting device; and
a processing unit configured to process information on light received by the light-receiving unit to measure a distance from the light-emitting device to the target object or a shape of the target object.

19. A light-emitting device comprising:
a base material;
an electrode that is disposed on a front surface of the base material, that has a light-emitting element on a front surface of the electrode, and that is electrically connected to an entire bottom surface of the light-emitting element;

a connection portion disposed at a position separated from the electrode on the front surface of the base material and connected to a conductive portion having a reference potential; and a heat transfer member that is configured with an insulator, that is in contact with the front surface of the electrode and a front surface of the connection portion, and that is configured to transfer heat from the electrode to the connection portion.

* * * * *